(12) United States Patent
Krymski

(10) Patent No.: US 7,804,438 B2
(45) Date of Patent: Sep. 28, 2010

(54) IMAGE SENSORS AND DUAL RAMP ANALOG-TO-DIGITAL CONVERTERS AND METHODS

(76) Inventor: Alexander Krymski, 1028 N. Lake, Suite 204, Pasadena, CA (US) 91104

( * ) Notice: Subject to any disclaimer, the term of this patent is extended or adjusted under 35 U.S.C. 154(b) by 42 days.

(21) Appl. No.: 12/434,602

(22) Filed: May 1, 2009

(65) Prior Publication Data

US 2009/0273500 A1    Nov. 5, 2009

Related U.S. Application Data

(60) Provisional application No. 61/050,071, filed on May 2, 2008.

(51) Int. Cl.
*H03M 1/82* (2006.01)
(52) U.S. Cl. .............. 341/167; 341/155; 341/156; 341/169; 341/170
(58) Field of Classification Search ................ 341/113, 341/128, 129, 155, 156, 169, 170
See application file for complete search history.

(56) References Cited

U.S. PATENT DOCUMENTS

| | | | | |
|---|---|---|---|---|
| 4,074,257 A * | 2/1978 | Henry | .......... | 341/120 |
| 5,757,520 A | 5/1998 | Takashima | | |
| 5,920,274 A * | 7/1999 | Gowda et al. | ........ | 341/155 |
| 6,115,065 A | 9/2000 | Yadid-Pecht et al. | | |
| 6,144,330 A * | 11/2000 | Hoffman et al. | ........ | 341/166 |
| 6,545,624 B2 * | 4/2003 | Lee et al. | ........ | 341/155 |
| 6,552,745 B1 | 4/2003 | Perner | | |
| 6,573,936 B2 | 6/2003 | Morris et al. | | |
| 6,670,904 B1 * | 12/2003 | Yakovlev | ........ | 341/167 |
| 6,870,565 B1 | 3/2005 | Blerkom et al. | | |
| 6,953,923 B2 | 10/2005 | Yang et al. | | |
| 7,012,557 B2 * | 3/2006 | Takayanagi et al. | ........ | 341/155 |

(Continued)

FOREIGN PATENT DOCUMENTS

JP    2001-024954    1/2001

OTHER PUBLICATIONS

A. Krymski et al., "A High Speed, 500 Frames/s, 1024×1024 CMOS Active Pixel Sensor", 1999 Symposium on VLSI Circuits Digest of Technical Papers, 1999, Kyoto, Japan, pp. 137-138.

(Continued)

*Primary Examiner*—Linh V Nguyen
(74) *Attorney, Agent, or Firm*—Foley & Lardner LLP

(57) ABSTRACT

Dual ramp analog-to-digital converters and methods allow for performing analog-to-digital conversion of an analog signal. Various dual ramp analog-to-digital converters and methods allow for applying the analog signal and a coarse ramp to a same input of a comparator, and applying a fine ramp to another input of the comparator. Some dual ramp analog-to-digital converters and methods allow for applying the analog signal, a coarse ramp, and a fine ramp to a same input of a comparator. Various dual ramp analog-to-digital converters and methods allow for applying the analog signal to an input of a first comparator, applying a coarse ramp to the input of the first comparator through a coarse ramp switch, applying the analog signal to an input of a second comparator, and applying a fine ramp to another input of the second comparator.

20 Claims, 10 Drawing Sheets

U.S. PATENT DOCUMENTS

| | | | | |
|---|---|---|---|---|
| 7,148,831 | B2 * | 12/2006 | Krymski | 341/155 |
| 7,238,977 | B2 | 7/2007 | Hong et al. | |
| 7,443,437 | B2 | 10/2008 | Altice, Jr. et al. | |
| 7,471,324 | B2 | 12/2008 | Tu et al. | |
| 7,488,928 | B2 | 2/2009 | Krymski | |
| 7,528,760 | B2 * | 5/2009 | Forejt | 341/166 |
| 7,554,478 | B2 * | 6/2009 | Lim | 341/169 |
| 7,554,479 | B2 * | 6/2009 | Lim | 341/169 |
| 7,616,147 | B2 * | 11/2009 | Huang et al. | 341/169 |
| 2003/0011829 | A1 | 1/2003 | Dierickx | |
| 2003/0043089 | A1 | 3/2003 | Hanson et al. | |
| 2006/0164277 | A1 * | 7/2006 | Lee | 341/155 |
| 2007/0076109 | A1 | 4/2007 | Krymski | |
| 2007/0139242 | A1 | 6/2007 | Krymski | |

OTHER PUBLICATIONS

S. Kleinfelder, S.H. Lim, X.Q. Liu and A. El Gamal, "A 10,000 Frames/s CMOS Digital Pixel Sensor," IEEE Journal of Solid State Circuits, vol. 36, No. 12, pp. 2049-2059, Dec. 2001.

Jeonghwan Lee, Seunghyum Lim, and Gunhee Han, "A 10b Column-Wise Two-Step Single-Slope ADC for High-Speed CMOS Image Sensor," Department of Electrical and Electronic Engineering, Yonsei University, pp. 196-199.

PCT International Search Report and Written Opinion report dated Aug. 29, 2007 from PCT application PCT/US06/38643.

* cited by examiner

IMAGE SENSORS AND DUAL RAMP ANALOG-TO-DIGITAL CONVERTERS AND METHODS

CROSS-REFERENCE TO RELATED PATENT APPLICATIONS

This application claims the benefit of U.S. Provisional App. Ser. No. 61/050,071, entitled "Image Sensor Circuits, Analog-to-Digital Converter Circuits, and Methods With Same", filed May 2, 2008, the entire contents of which are incorporated by reference herein.

BACKGROUND OF THE INVENTION

1. Field of the Invention

Embodiments of the present invention relate generally to dual ramp analog-to-digital converters and methods, and in specific embodiments to image sensors that include dual ramp analog-to-digital converters.

2. Related Art

Various designs for double ramp or dual ramp analog-to-digital converters (ADCs) are disclosed in U.S. Pat. No. 6,670,904, entitled "Double-Ramp ADC for CMOS Sensors", the entire contents of which are incorporated by reference herein. U.S. Pat. No. 6,670,904 is hereinafter referred to as the '904 patent. The abstract of the '904 patent discusses a double ramp ADC that divides an analog-to-digital conversion process into two steps. During a first step of the conversion, the double ramp ADC runs through potential digital values roughly, using coarse counter steps, and maintains a coarse digital output value. During a second step of the conversion, the ADC runs through individual digital values within the range of values associated with the coarse digital value. Thus, the second step runs through fine digital values associated with the coarse digital value. The coarse and fine digital values are then output as the converted digital value of an analog input signal.

FIG. 1 illustrates a double ramp ADC 300 as disclosed in the '904 patent. As is discussed in column 3 of the '904 patent, the double ramp ADC 300 includes a capacitor 302, a switch 304, and a comparator 306. The comparator 306 receives an input voltage Vin to be converted at a first input. The input voltage Vin is an analog voltage output from a pixel within a pixel array of an image sensor or a difference between a pixel image voltage and a reset voltage output from a pixel. The capacitor 302 is connected between a fine ramp voltage Vfine and a second input of the comparator 306. The switch 304 is connected between a coarse ramp voltage Vcoarse and the second input of the comparator 306 that is connected to the capacitor 302.

FIG. 2 illustrates an example operation of the double ramp ADC 300 of FIG. 1 as disclosed in the '904 patent. As is discussed in columns 3 and 4 of the '904 patent, the example operation provides an example in which the double ramp ADC 300 has a 12-bit resolution and the output digital code, therefore, contains twelve bits, D11 through D0, with D11 being the most significant bit and D0 being the least significant bit. During the conversion process, the input voltage Vin is compared with a generated comparison voltage Vc. In the first conversion step, the fine ramp voltage Vfine is set to zero. In addition, the switch 304 is closed and the coarse ramp voltage Vcoarse is gradually changed from a maximum value to a minimum value in coarse voltage steps (i.e., steps greater than a single digital bit).

The '904 patent explains that the coarse ramp voltage Vcoarse may be associated with the most-significant bits ("MSBs") of the output digital code, while the fine ramp voltage Vfine may be associated with the least-significant bits ("LSBs") of the output digital code. Sometime during the first conversion step, when the coarse ramp voltage Vcoarse is less than or equal to the input voltage Vin, the comparator output voltage Vcmp changes from a one to a zero, which is a signal for control logic to latch the most significant bits in the output digital code (i.e., the bits used to generate the coarse ramp voltage Vcoarse). The control logic also uses the change in the comparator output voltage Vcmp to open the switch 304. During the time that the switch 304 was closed, the capacitor 302 was constantly being charged with the coarse ramp voltage Vcoarse. When the switch 304 is opened, the charging of the capacitor 302 is interrupted and the last coarse ramp voltage Vcoarse is saved within the capacitor 302.

The '904 patent explains that during the second conversion step, the fine ramp voltage Vfine is gradually changed from zero up to its maximum (i.e., the maximum allowable value within the range of the coarse voltage). Because the switch 304 is open, the fine ramp voltage Vfine is added to the coarse ramp voltage Vcoarse that is stored in the capacitor 302. As such, the generated comparison voltage Vc is equal to the saved coarse ramp voltage Vcoarse plus the fine ramp voltage Vfine. The generated comparison voltage Vc is compared to the input voltage Vin. Sometime during the second step, when the generated comparison voltage Vc is equal to the input voltage Vin, the comparator output voltage Vcmp changes from a zero to a one, which is a signal for the control logic to latch the least significant bits in the output digital code (i.e., the bits of the code used to generate the fine ramp voltage Vfine). The MSBs and LSBs form the converted output digital code representing the original analog input voltage Vin.

FIG. 3 illustrates an example control circuit 400 for controlling the double ramp ADC 300 of FIG. 1 as disclosed in the '904 patent. As is discussed in columns 6 and 7 of the '904 patent, the control circuit 400 includes control logic 402, a counter 404, a digital-to-analog converter (DAC) 406, and a latch circuit 408. The DAC 406 inputs a digital counter value COUNT and generates an analog ramp voltage Vramp that is sent to the double ramp ADC 300. The ramp voltage Vramp is the coarse ramp voltages Vcoarse during the first conversion step and is the fine ramp voltages Vfine during the second conversion step.

The '904 patent explains that the control logic 402 programs the counter 404 by sending it an initial counter value over the INITIAL VALUE lines, a count up/down signal over an UP/DOWN line and an increment/decrement value over the INC/DEC lines. A start/stop counter signal line START/STOP is used to start or stop the counter 404. The counter 404 inputs these signals and data and, when enabled, begins counting (up or down) with the appropriate increment/decrement every clock CLK cycle. The counter 404 outputs the digital counter value COUNT to the DAC 406 every clock CLK cycle.

As explained in the '904 patent, for the first conversion step, the control logic 402 sets the counter to the maximum count value via the INITIAL VALUE lines. The control logic 402 sets the counter to count down via the UP/DOWN line and sets the appropriate decrement value via the INC/DEC lines. To count in coarse steps, the decrement is set such that only the MSBs are decremented. When the first conversion step is to begin, the control logic 402 issues a start counter signal via the START/STOP signal line. When the control logic 402 detects that the comparator output Vcmp has switched from a one to a zero (i.e., the correct coarse voltage has been found), the control logic 402 issues a stop counter signal to the counter 404 and a latch counter signal to the latch circuit 408, which latches the counter value COUNT. The control logic 402 also changes the state of the switch 304 in the double ramp ADC 300 via the ADC SWITCH CONTROL lines to prepare for the second conversion step. The control logic 402 then resets the counter 404 for the second conversion step.

The '904 patent explains that to prepare for the second conversion step, the control logic 402 sets the counter to zero via the INITIAL VALUE lines. The control logic 402 sets the counter to count up via the UP/DOWN signal and sets the appropriate increment value via the INC/DEC lines. To count in fine steps, the increment is set to one. When the second conversion step is to begin, the control logic 402 issues a start counter signal via the START/STOP signal line. When the control logic 402 detects that the comparator output Vcmp has switched from a zero to a one (i.e., the correct coarse plus fine voltage has been found), the logic 402 issues a stop counter signal to the counter 404 and a latch counter signal to the latch circuit 408, which latches the counter value COUNT and outputs the digital code DIGITAL OUTPUT CODE corresponding to the input voltage Vin.

The '904 patent notes that the coarse ramp voltage Vcoarse could be gradually changed from a minimum value to a maximum value in coarse voltage steps if so desired, and that the fine ramp voltage Vfine could be gradually changed from a maximum value to a minimum value in fine voltage steps if so desired.

Another related art analog-to-digital converter is disclosed in J. Lee et al., "A 10b Column-wise Two-step Single-slope ADC for High-speed CMOS Image Sensor", Int. Image Sensor Workshop, Ogunquit, Me., 2007, pp. 196-199, the entire contents of which are incorporated by reference herein.

In the related art implementations, the analog signal to be converted and the ramp are applied to different inputs of a comparator. This means that the compensation of the input signal by ramp occurs at different absolute value of the input voltage. Since the comparator must be fast, the first stage cannot have high gain. As a consequence, the comparator behaves as a non-ideal opamp with signal dependent input offset voltage. As this dependence is nonlinear in general, especially on large signals, and as the offset varies from column-to-column in an image sensor, the related art types of ADCs are likely to exhibit large column-to-column fixed pattern noise (FPN) and nonlinearity.

SUMMARY OF THE DISCLOSURE

Various embodiments of the present invention relate to dual ramp analog-to-digital converters and methods. Also, various embodiments of the present invention relate to image sensors that include dual ramp analog-to-digital converters. In various embodiments of the present invention, an analog signal to be converted and a coarse ramp are applied to a same input of a comparator and a fine ramp is applied to an opposite input of the comparator. In some embodiments of the present invention, a coarse ramp and a fine ramp are applied to a same input of a comparator to which an analog signal to be converted is applied. In various embodiments of the present invention, a coarse ramp is applied through a coarse ramp switch to an input of a first comparator, a fine ramp is applied to an input of a second comparator, and the second comparator compensates for switch feedthrough from the coarse ramp switch.

A method in accordance with an embodiment of the present invention for performing analog-to-digital conversion of an analog signal comprises applying the analog signal and a coarse ramp to a same input of a comparator, and applying a fine ramp to another input of the comparator. In various embodiments, the analog signal is an output signal of a pixel. Also, in various embodiments, the analog signal is an output signal of an amplifier that amplifies a difference between a pixel image signal and a pixel reset signal.

In some embodiments, the method further comprises generating the coarse ramp using a digital-to-analog converter to convert a digital counter value to the coarse ramp. Also, in some embodiments, the method further comprises generating the fine ramp using a digital-to-analog converter to convert a digital counter value to the fine ramp. In various embodiments, the coarse ramp is used to determine most-significant-bits of a digital value for the analog signal, and the fine ramp is used to determine least-significant-bits of the digital value for the analog signal.

In some embodiments, the applying of the analog signal and the coarse ramp to the same input of the comparator comprises applying the analog signal and the coarse ramp to the same input of the comparator through one or more circuit elements such that a signal at the input of the comparator is based on the analog signal and the coarse ramp. Also, in some embodiments, the applying of the analog signal and the coarse ramp to the same input of the comparator comprises providing the coarse ramp to a first terminal of a first capacitor, and providing the analog signal to a second terminal of the first capacitor, where the second terminal of the first capacitor is connected to a first terminal of a second capacitor, and a second terminal of the second capacitor is connected to the input of the comparator.

A dual ramp analog-to-digital converter in accordance with an embodiment of the present invention for performing analog-to-digital conversion of an analog signal comprises at least one circuit element to which the analog signal and a coarse ramp are applied, and a comparator comprising an input connected to the at least one circuit element, and another input connected to receive a fine ramp. In various embodiments, the at least one circuit element includes a storage element, and the storage element has a first terminal connected to receive the coarse ramp and a second terminal connected to receive the analog signal. In some embodiments, the storage element comprises a capacitor. In various embodiments, the second terminal of the storage element is connected to the input of the comparator. In some embodiments, the second terminal of the storage element is connected to the input of the comparator through one or more circuit elements.

A method in accordance with an embodiment of the present invention for performing analog-to-digital conversion of an analog signal comprises applying the analog signal to an input of a comparator, applying a coarse ramp to the same input of the comparator to which the analog signal is applied, and applying a fine ramp to the same input of the comparator to which the analog signal is applied. In various embodiments, the analog signal is an output signal of a pixel or an output signal of an amplifier that amplifies a difference between a pixel image signal and a pixel reset signal.

A dual ramp analog-to-digital converter in accordance with an embodiment of the present invention for performing analog-to-digital conversion of an analog signal comprises a comparator, and one or more circuit elements through which the analog signal, a coarse ramp, and a fine ramp are applied to a same input of the comparator.

A method in accordance with an embodiment of the present invention for performing analog-to-digital conversion of an analog signal comprises applying the analog signal to an input of a first comparator, applying a coarse ramp to the input of the first comparator through a coarse ramp switch, applying the analog signal to an input of a second comparator, and applying a fine ramp to another input of the second comparator. In various embodiments, the method further comprises compensating by the second comparator for switch feedthrough from the coarse ramp switch.

A dual ramp analog-to-digital converter in accordance with an embodiment of the present invention for performing analog-to-digital conversion of an analog signal comprises a first comparator comprising an input to which the analog signal is applied, a coarse ramp switch that is controllable to selectively apply a coarse ramp to the same input of the first comparator to which the analog signal is applied, and a second comparator for compensating for switch feedthrough from the coarse ramp switch, where the second comparator comprises an input to which a fine ramp is applied. In some embodiments, the coarse ramp switch is connected to be controlled by an output of the first comparator.

DETAILED DESCRIPTION OF PREFERRED EMBODIMENTS

Figure 4:
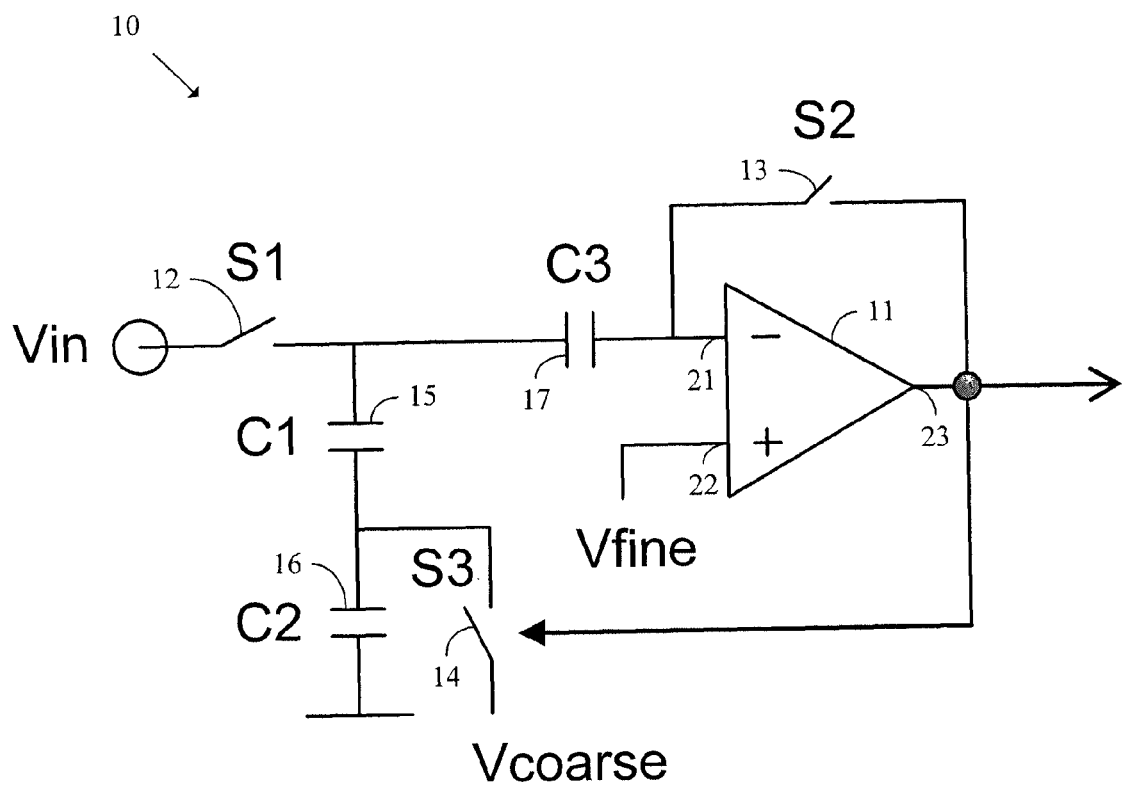
FIG. 4 illustrates a dual ramp ADC in accordance with an embodiment of the present invention.

FIG. 4 illustrates a dual ramp analog-to-digital converter (ADC) 10 in accordance with an embodiment of the present invention. The dual ramp ADC 10 comprises a comparator 11, a first switch 12, a second switch 13, a third switch 14, a first capacitor 15, a second capacitor 16, and a third capacitor 17. The comparator 11 includes a first input 21, a second input 22, and an output 23. In various embodiments, the first input 21 of the comparator 11 is a negative input of the comparator 11 and the second input 22 of the comparator 11 is a positive input of the comparator 11.

A first terminal of the first switch 12 is connected to receive an analog signal (Vin) to be converted, and a second terminal of the first switch 12 is connected to a first terminal of the third capacitor 17. A second terminal of the third capacitor 17 is connected to the first input 21 of the comparator 11. A first terminal of the second switch 13 is connected to the first input 21 of the comparator 11, and a second terminal of the second switch 13 is connected to the output 23 of the comparator 11.

Figure 1:
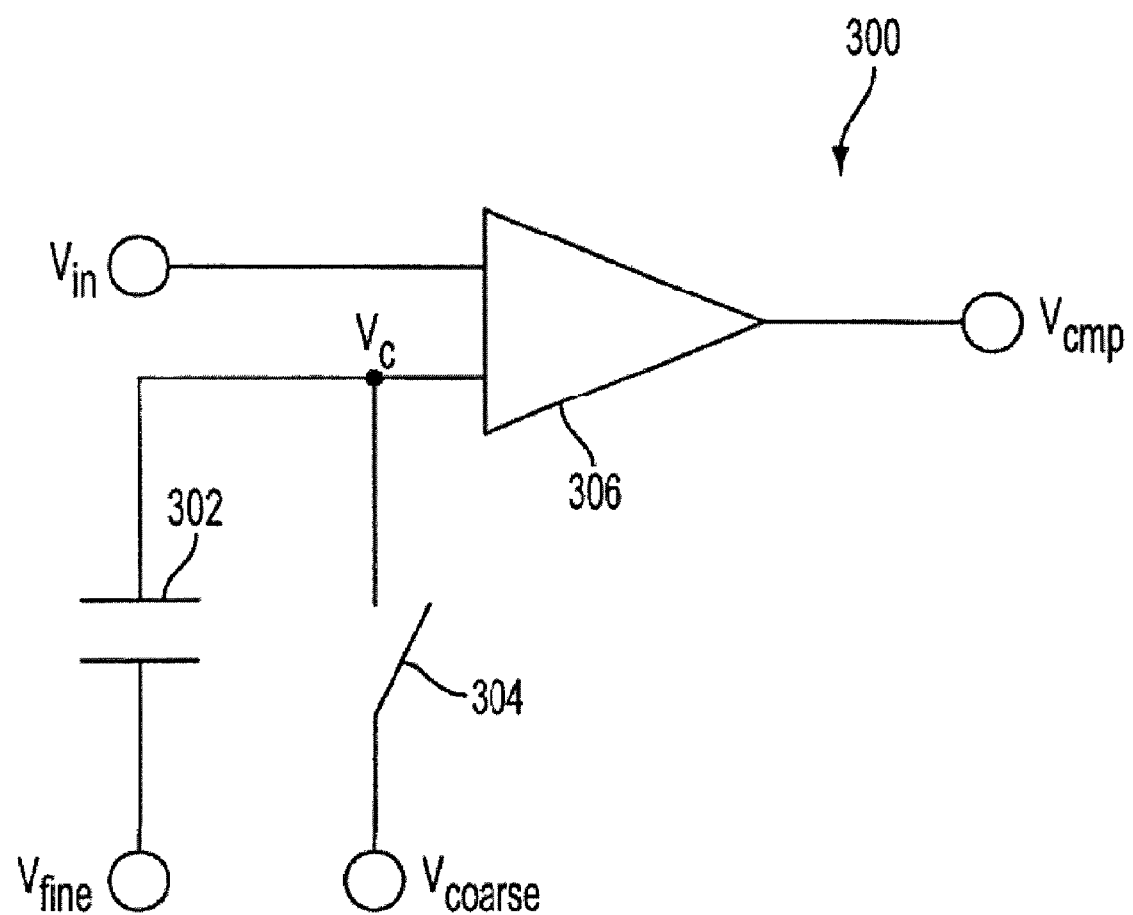
FIG. 1 illustrates a related art double ramp analog-to-digital converter (ADC)
Figure 2:
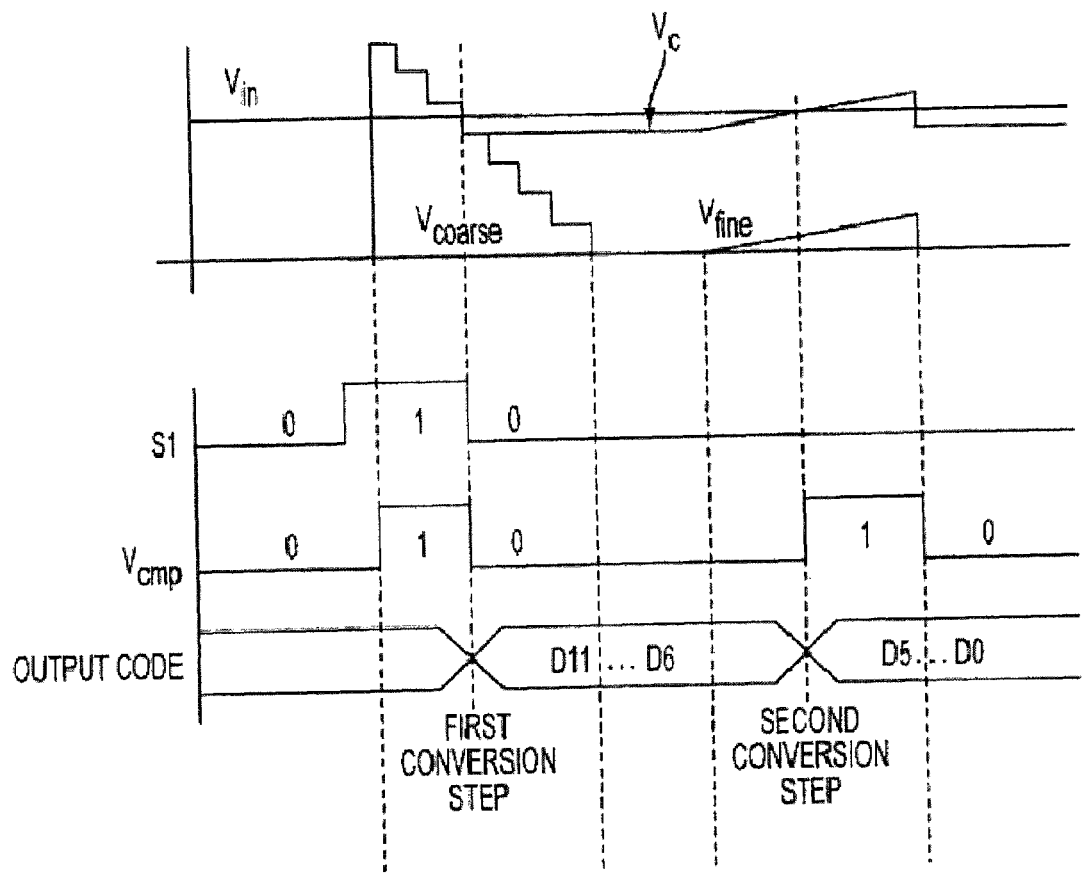
FIG. 2 illustrates an example operation of a double ramp ADC.
Figure 3:
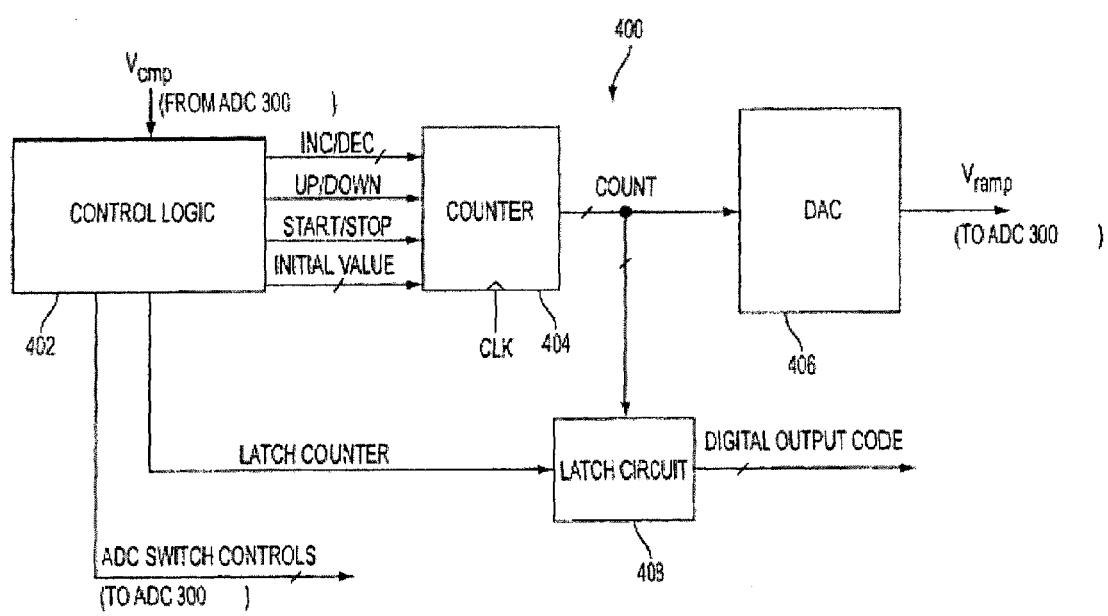
FIG. 3 illustrates an example of a control circuit for controlling a double ramp ADC.

A first terminal of the third switch 14 is connected to receive a coarse ramp (Vcoarse), and a second terminal of the third switch 14 is connected to a first terminal of the first capacitor 15. A second terminal of the first capacitor 15 is connected to the second terminal of the first switch 12 and to the first terminal of the third capacitor 17. A first terminal of the second capacitor 16 is connected to ground, and a second terminal of the second capacitor 16 is connected to the second terminal of the third switch 14 and to the first terminal of the first capacitor 15. The third switch 14 is controllable by output values from the comparator 11. The second input 22 of the comparator 11 is connected to receive a fine ramp (Vfine). The coarse ramp and the fine ramp may be generated by one or more control circuits, such as the control circuit 400 (refer to FIG. 3), or the like.

Figure 5:
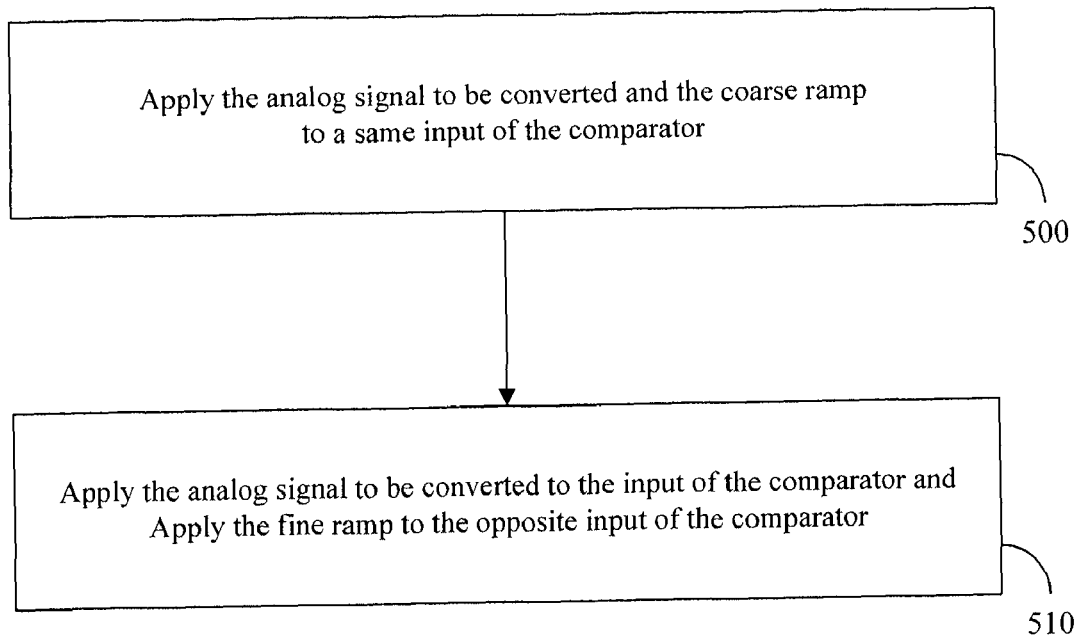
FIG. 5 illustrates a method in accordance with an embodiment of the present invention for performing analog-to-digital conversion of an analog signal.

FIG. 5 illustrates a method in accordance with an embodiment of the present invention for performing analog-to-digital conversion of an analog signal using the dual ramp ADC 10 of FIG. 4. With reference to FIGS. 4 and 5, in step 500, the analog signal to be converted and the coarse ramp Vcoarse are applied to the same first input 21 of the comparator 11 by having the first switch 12 closed and the third switch 14 closed. In some embodiments, the applying of the analog signal and the coarse ramp to the same first input 21 of the comparator 11 includes applying the analog signal and the coarse ramp to the same first input 21 of the comparator 11 through one or more circuit elements, such as a capacitor, a switch, a transistor, or the like, such that a signal at the first input 21 of the comparator 11 is based on the analog signal and the coarse ramp. Also, in some embodiments, the applying of the analog signal and the coarse ramp to the same first input 21 of the comparator 11 includes providing the coarse ramp to the first terminal of the first capacitor 15 and providing the analog signal to the second terminal of the first capacitor 15, where the second terminal of the first capacitor 15 is connected to the first terminal of the third capacitor 17 and the second terminal of the third capacitor 17 is connected to the first input 21 of the comparator 11. When an output signal from the output 23 of the comparator 11 changes value, the most-significant bits of a digital value for the analog signal are stored, and the third switch 14 is opened. The method then continues to step 510.

In step 510, the analog signal being converted remains applied to the first input 21 of the comparator 11, and the fine ramp Vfine is applied to the second input 22 of the comparator 11. When an output signal from the output 23 of the comparator 11 changes value, the least-significant bits of the digital value for the analog signal are stored, and the conversion ends. In various embodiments, the coarse ramp Vcoarse is generated using a digital-to-analog converter to convert a digital counter value to the coarse ramp. Also, in various embodiments, the fine ramp Vfine is generated using a digital-to-analog converter to convert a digital counter value to the fine ramp.

Thus, in accordance with various embodiments of the present invention, an input analog signal to be converted and a coarse ramp are applied to a same input of a comparator. This means that the compensation of the signal by the coarse ramp occurs at a level of comparator input voltage close to zero. The effect of nonlinear input offset of the comparator is removed. In the embodiment of FIG. 4, the fine ramp is applied to the opposite input of the comparator from the input to which the analog signal to be converted and the coarse ramp are applied. However, the fine ramp is a small signal, so the low gain input offset error is linear and could be easily compensated.

Figure 6:
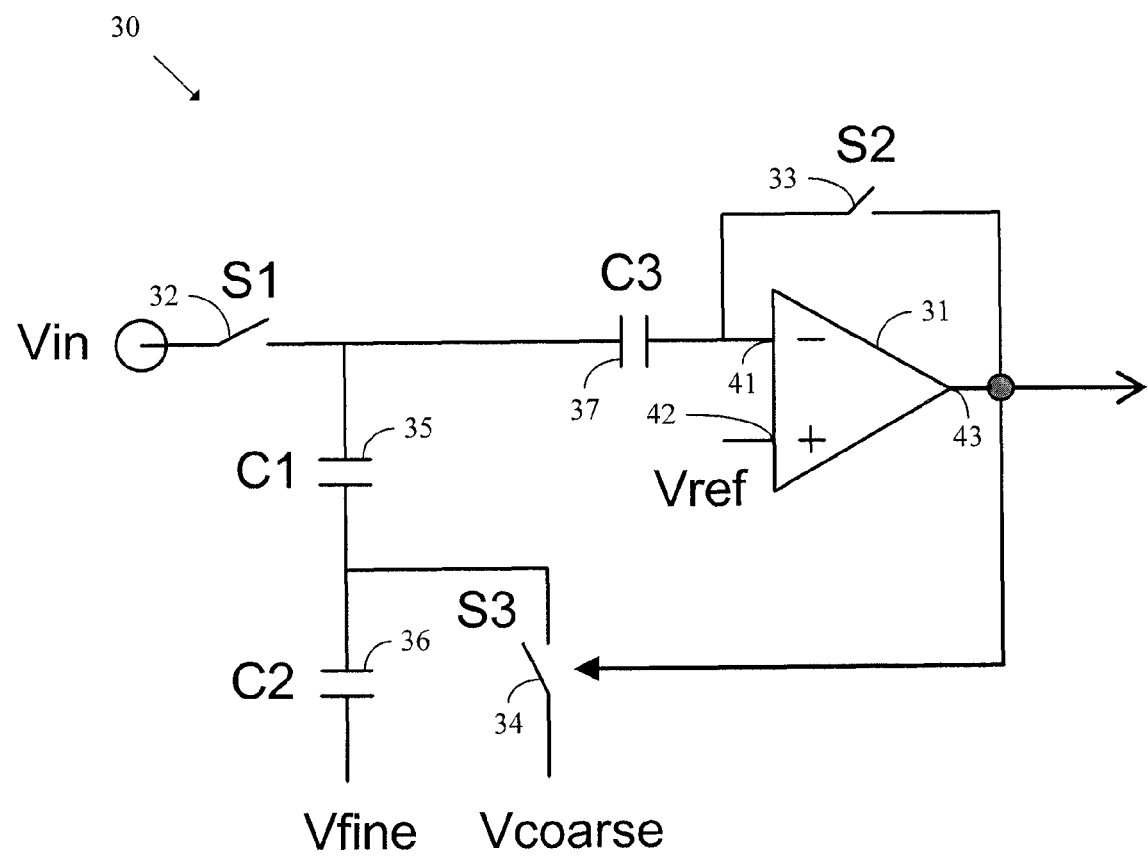
FIG. 6 illustrates a dual ramp ADC in accordance with an embodiment of the present invention.

FIG. 6 illustrates a dual ramp ADC 30 in accordance with an embodiment of the present invention. The dual ramp ADC 30 comprises a comparator 31, a first switch 32, a second switch 33, a third switch 34, a first capacitor 35, a second capacitor 36, and a third capacitor 37. The comparator 31 includes a first input 41, a second input 42, and an output 43. In various embodiments, the first input 41 of the comparator 31 is a negative input of the comparator 31 and the second input 42 of the comparator 31 is a positive input of the comparator 31.

A first terminal of the first switch 32 is connected to receive an analog signal (Vin) to be converted, and a second terminal of the first switch 32 is connected to a first terminal of the third capacitor 37. A second terminal of the third capacitor 37 is connected to the first input 41 of the comparator 31. A first terminal of the second switch 33 is connected to the first input 41 of the comparator 31, and a second terminal of the second switch 33 is connected to the output 43 of the comparator 31.

A first terminal of the third switch 34 is connected to receive a coarse ramp (Vcoarse), and a second terminal of the third switch 34 is connected to a first terminal of the first capacitor 35. A second terminal of the first capacitor 35 is connected to the second terminal of the first switch 32 and to the first terminal of the third capacitor 37. A first terminal of the second capacitor 36 is connected to receive a fine ramp (Vfine), and a second terminal of the second capacitor 36 is connected to the second terminal of the third switch 34 and to the first terminal of the first capacitor 35. The third switch 34 is controllable by output values from the comparator 31. The second input 42 of the comparator 31 is connected to receive a reference voltage (Vref). The coarse ramp and the fine ramp may be generated by one or more control circuits, such as the control circuit 400 (refer to FIG. 3), or the like.

Figure 7:
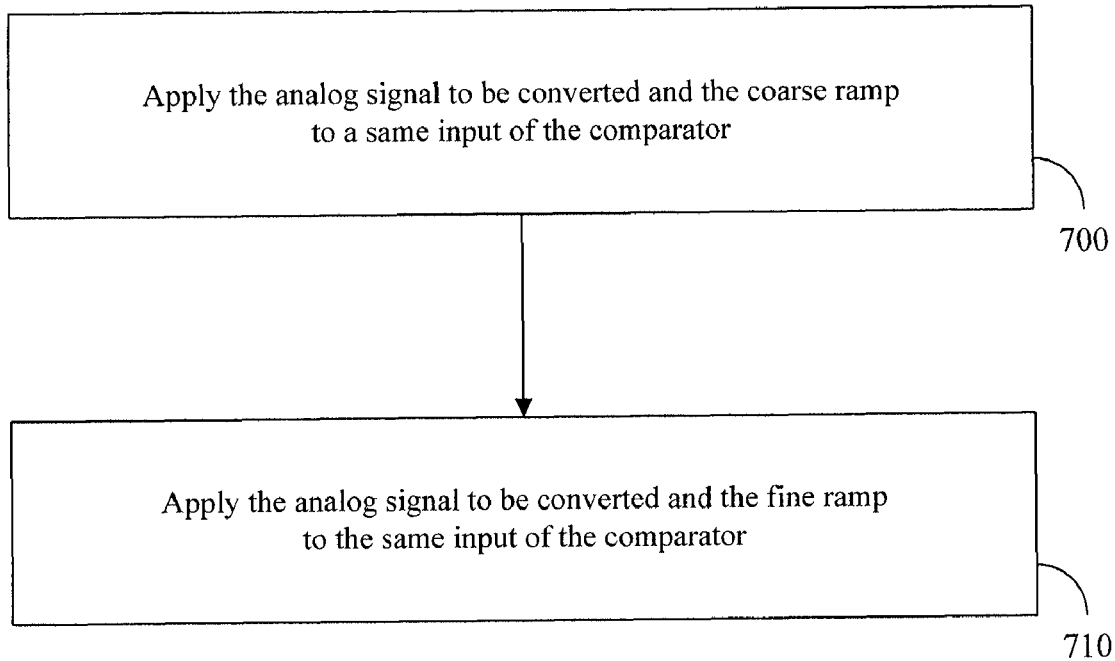
FIG. 7 illustrates a method in accordance with an embodiment of the present invention for performing analog-to-digital conversion of an analog signal.

FIG. 7 illustrates a method in accordance with an embodiment of the present invention for performing analog-to-digital conversion of an analog signal using the dual ramp ADC 30 of FIG. 6. With reference to FIGS. 6 and 7, in step 700, the analog signal to be converted and the coarse ramp Vcoarse are applied to the same first input 41 of the comparator 31 by having the first switch 32 closed and the third switch 34 closed. In some embodiments, the applying of the analog signal and the coarse ramp to the same first input 41 of the comparator 31 includes applying the analog signal and the coarse ramp to the same first input 41 of the comparator 31 through one or more circuit elements, such as a capacitor, a switch, a transistor, or the like, such that a signal at the first input 41 of the comparator 31 is based on the analog signal and the coarse ramp. Also, in some embodiments, the applying of the analog signal and the coarse ramp to the same first input 41 of the comparator 31 includes providing the coarse ramp to the first terminal of the first capacitor 35 and providing the analog signal to the second terminal of the first capacitor 35, where the second terminal of the first capacitor 35 is connected to the first terminal of the third capacitor 37 and the second terminal of the third capacitor 37 is connected to the first input 41 of the comparator 31. When an output signal from the output 43 of the comparator 31 changes value, the most-significant bits of a digital value for the analog signal are stored, and the third switch 34 is opened. The method then continues to step 710.

In step 710, the analog signal to be converted and the fine ramp Vfine are applied to the same first input 41 of the comparator 31. In some embodiments, the applying of the analog signal and the fine ramp to the same first input 41 of the comparator 31 includes applying the analog signal and the fine ramp to the same first input 41 of the comparator 31 through one or more circuit elements, such as a capacitor, a switch, a transistor, or the like, such that a signal at the first input 41 of the comparator 31 is based on the analog signal and the fine ramp. When an output signal from the output 43 of the comparator 31 changes value, the least-significant bits of the digital value for the analog signal are stored, and the conversion ends.

Thus, in accordance with various embodiments of the present invention, an input analog signal to be converted as well as coarse and fine ramps are all applied to a same input of a comparator. This means that the compensation of the signal by the coarse ramp occurs at a level of comparator input voltage equal to zero. The effect of nonlinear input offset of the comparator is removed.

Figure 8:
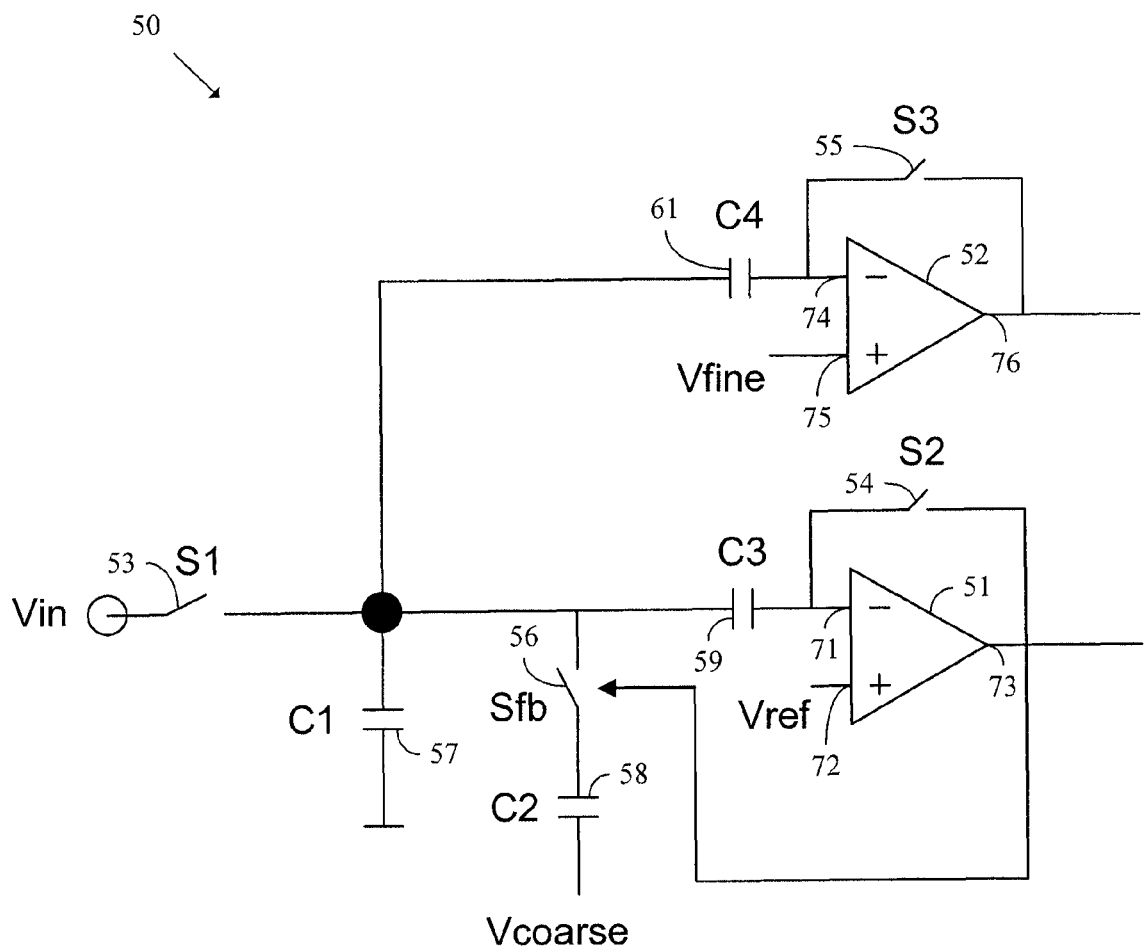
FIG. 8 illustrates a dual ramp ADC in accordance with an embodiment of the present invention.

FIG. 8 illustrates a dual ramp ADC 50 in accordance with an embodiment of the present invention. The dual ramp ADC 50 comprises a first comparator 51, a second comparator 52, a first switch 53, a second switch 54, a third switch 55, a feedback switch 56, a first capacitor 57, a second capacitor 58, a third capacitor 59, and a fourth capacitor 61. The first comparator 51 includes a first input 71, a second input 72, and an output 73. In various embodiments, the first input 71 of the first comparator 51 is a negative input of the first comparator 51 and the second input 72 of the first comparator 51 is a positive input of the first comparator 51. The second comparator 52 includes a first input 74, a second input 75, and an output 76. In various embodiments, the first input 74 of the second comparator 52 is a negative input of the second comparator 52 and the second input 75 of the second comparator 52 is a positive input of the second comparator 52.

A first terminal of the first switch 53 is connected to receive an analog signal (Vin) to be converted, and a second terminal of the first switch 53 is connected to a first terminal of the third capacitor 59. A second terminal of the third capacitor 59 is connected to the first input 71 of the first comparator 51. A first terminal of the second switch 54 is connected to the first input 71 of the first comparator 51, and a second terminal of the second switch 54 is connected to the output 73 of the first comparator 51. A first terminal of the first capacitor 57 is connected to ground, and a second terminal of the first capacitor 57 is connected to the second terminal of the first switch 53. A first terminal of the second capacitor 58 is connected to receive a coarse ramp (Vcoarse), and a second terminal of the second capacitor 58 is connected to a first terminal of the feedback switch 56. A second terminal of the feedback switch 56 is connected to the first terminal of the third capacitor 59. The feedback switch 56 is controllable by an output value from the output 73 of the first comparator 51. The second input 72 of the first comparator 51 is connected to receive a reference voltage (Vref).

A first terminal of the fourth capacitor 61 is connected to the second terminal of the first switch 53, and a second terminal of the fourth capacitor 61 is connected to the first input 74 of the second comparator 52. A first terminal of the third switch 55 is connected to the first input 74 of the second comparator 52, and a second terminal of the third switch 55 is connected to the output 76 of the second comparator 52. The second input 75 of the second comparator 52 is connected to receive a fine ramp (Vfine).

In dual ramp schemes, there is a potential error source associated with charge injection from a feedback switch that disconnects the coarse ramp after a comparator detects the compensation by the coarse ramp. The dual ramp ADC 50 includes the second comparator 52 which may be, for example, an autozero comparator, that memorizes the switch feedthrough from the feedback switch 56. The second comparator 52 is able to store and compensate for the switch feedthrough from the feedback switch 56. A sequence of operations for providing such compensation for analog-to-digital conversion is as follows:

(i) Before sampling of the input analog signal, perform auto-zeroing of both the first comparator 51 and the second comparator 52 from the input reference signal with the coarse and fine ramps in initial positions and with the feedback switch 56 closed;

(ii) Disconnect the first switch 53, then disconnect the second switch 54, then disconnect the feedback switch 56, then disconnect the third switch 55;

(iii) Connect the feedback switch 56, sample the input signal Vin, apply the coarse ramp, detect the coarse value of the input signal using the first comparator 51, and disconnect the feedback switch 56;

(iv) Apply the fine ramp and determine the fine value of the input signal from the second comparator 52.

In various embodiments, the first comparator 51 and the second comparator 52 are complimentary to each other. In such embodiments, after both of the comparators 51 and 52 fire, the kick-back charge injection is compensated in the first order of magnitude. To have complimentary comparators, either one comparator is NMOS while the other is PMOS, or they are of the same type but a polarity of a connection to a common input node is swapped.

Figure 9:
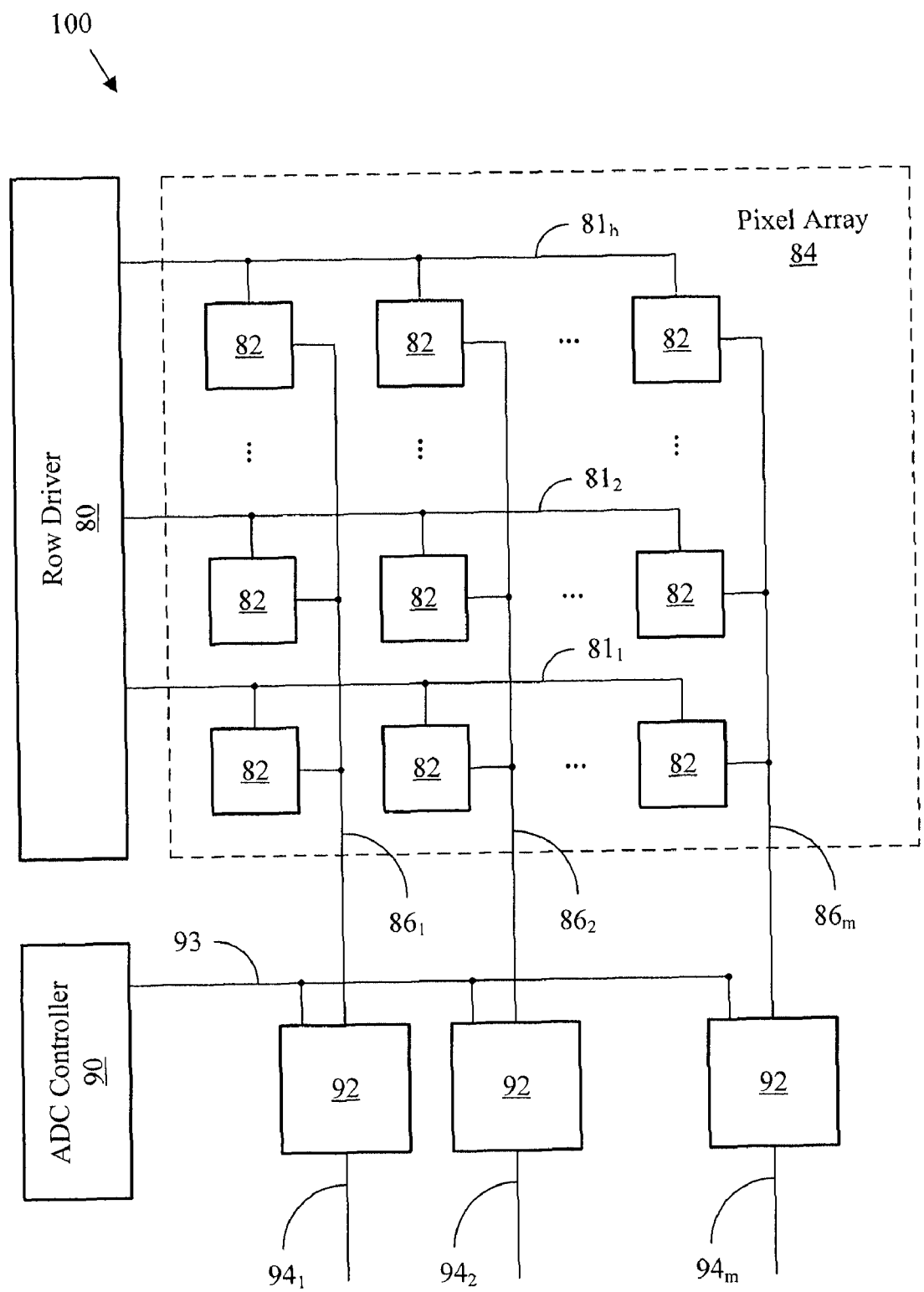
FIG. 9 illustrates an image sensor in accordance with an embodiment of the present invention.

FIG. 9 illustrates an architecture of an image sensor 100 in accordance with an embodiment of the present invention. As illustrated in FIG. 9, the image sensor 100 comprises a pixel array 84, a row driver 80, an ADC controller 90, and a plurality of column readout circuits 92. The pixel array 84 comprises pixels 82 that are arranged in rows and columns. Each pixel 82 comprises a light sensitive element, such as a photodiode, or the like, to sample light intensity of a corresponding portion of a scene being imaged, and each pixel 82 is configured to produce an analog pixel signal based on the sampled light intensity. The row driver 80 supplies control signals to the pixels 82 in the pixel array 84 to control an operation of the pixels 82.

Pixels 82 that are in a same row of the pixel array 84 share common row control signals from the row driver 80. For example, pixels 82 in a first row of the pixel array 84 share common row control lines $81_1$ for receiving control signals from the row driver 80. Similarly, pixels 82 in a second row of the pixel array 84 share common row control lines $81_2$ for receiving control signals from the row driver 80, and pixels 82 in an $h^{th}$ row of the pixel array 84 share common row control lines $81_h$ for receiving control signals from the row driver 80. Pixels 82 that are in a same column of the pixel array 84 may share a common column readout line to provide output. For example, pixels 82 in a first column of the pixel array 84 share a column readout line $86_1$, pixels 82 in a second column of the pixel array 84 share a column readout line $86_2$, and pixels 82 in an $m^{th}$ column of the pixel array 84 share a column readout line $86_m$. In various embodiments, the row driver 80 controls the pixels 82 to provide output row by row.

In various embodiments, each column readout circuit 92 is connected to receive analog signals from a corresponding column readout line, and is configured to provide digital output on a corresponding output line. For example, the column readout circuit 92 for the first column is connected to the column readout line $86_1$ for receiving input, and is connected to an output line $94_1$ for providing output. Similarly, the column readout circuit 92 for the second column is connected to the column readout line $86_2$ for receiving input, and is connected to an output line $94_2$ for providing output, and the column readout circuit 92 for the $m^{th}$ column is connected to the column readout line $86_m$ for receiving input, and is connected to an output line $94_m$ for providing output. The ADC controller 90 is configured to provide control signals to the plurality of column readout circuits 92 over one or more control lines 93.

Figure 10A:
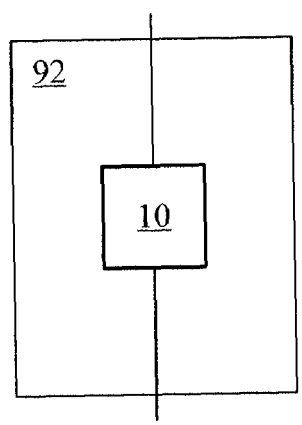
FIG. 10A illustrates a column readout circuit in accordance with an embodiment of the present invention.
Figure 10B:
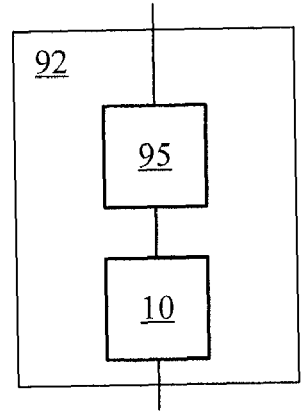
FIG. 10B illustrates a column readout circuit in accordance with an embodiment of the present invention.

FIG. 10A illustrates a design for the column readout circuit 92 in accordance with an embodiment of the present invention. The column readout circuit 92 of FIG. 10A includes the dual ramp ADC 10 of FIG. 4 for receiving pixel output signals from pixels and converting the pixel output signals to digital form. FIG. 10B illustrates another design for the column readout circuit 92 in accordance with an embodiment of the present invention. The column readout circuit 92 of FIG. 10B includes the dual ramp ADC 10 of FIG. 4 and an amplifier 95. The amplifier 95 amplifies a difference between a pixel image signal from a pixel and a pixel reset signal from a pixel, and provides the difference signal to the dual ramp ADC 10 to be converted to digital form.

Figure 10C:
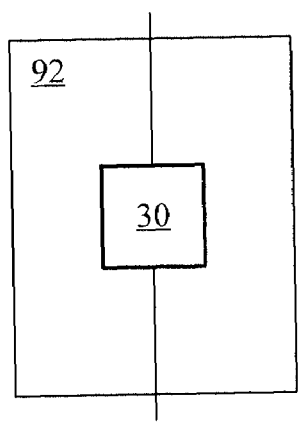
FIG. 10C illustrates a column readout circuit in accordance with an embodiment of the present invention.
Figure 10D:
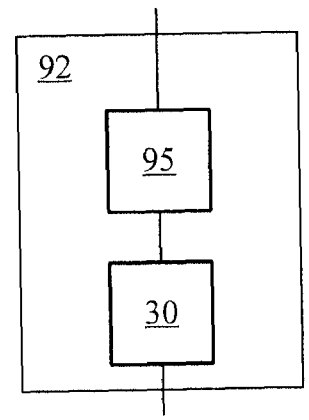
FIG. 10D illustrates a column readout circuit in accordance with an embodiment of the present invention.

FIG. 10C illustrates a design for the column readout circuit 92 in accordance with an embodiment of the present invention. The column readout circuit 92 of FIG. 10C includes the dual ramp ADC 30 of FIG. 6 for receiving pixel output signals from pixels and converting the pixel output signals to digital form. FIG. 10D illustrates another design for the column readout circuit 92 in accordance with an embodiment of the present invention. The column readout circuit 92 of FIG. 10D includes the dual ramp ADC 30 of FIG. 6 and an amplifier 95. The amplifier 95 amplifies a difference between a pixel image signal from a pixel and a pixel reset signal from a pixel, and provides the difference signal to the dual ramp ADC 30 to be converted to digital form.

Figure 10E:
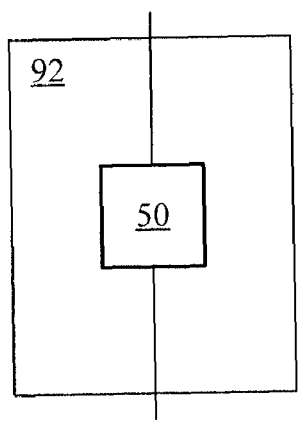
FIG. 10E illustrates a column readout circuit in accordance with an embodiment of the present invention.
Figure 10F:
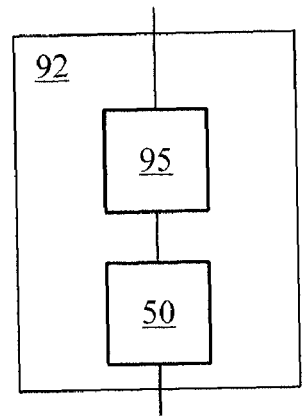
FIG. 10F illustrates a column readout circuit in accordance with an embodiment of the present invention.

FIG. 10E illustrates a design for the column readout circuit 92 in accordance with an embodiment of the present invention. The column readout circuit 92 of FIG. 10E includes the dual ramp ADC 50 of FIG. 8 for receiving pixel output signals from pixels and converting the pixel output signals to digital form. FIG. 10F illustrates another design for the column readout circuit 92 in accordance with an embodiment of the present invention. The column readout circuit 92 of FIG. 10F includes the dual ramp ADC 50 of FIG. 8 and an amplifier 95. The amplifier 95 amplifies a difference between a pixel image signal from a pixel and a pixel reset signal from a pixel, and provides the difference signal to the dual ramp ADC 50 to be converted to digital form.

The embodiments disclosed herein are to be considered in all respects as illustrative, and not restrictive of the invention. The present invention is in no way limited to the embodiments described above. Various modifications and changes may be made to the embodiments without departing from the spirit and scope of the invention. Various modifications and changes that come within the meaning and range of equivalency of the claims are intended to be within the scope of the invention.

What is claimed is:

1. A method for performing analog-to-digital conversion of an analog signal, comprising:
    applying the analog signal and a coarse ramp to a same input of a comparator; and
    applying a fine ramp to another input of the comparator.

2. The method of claim 1,
    wherein the analog signal is an output signal of a pixel.

3. The method of claim 1,
wherein the analog signal is an output signal of an amplifier that amplifies a difference between a pixel image signal and a pixel reset signal.

4. The method of claim 1, further comprising:
generating the coarse ramp using a digital-to-analog converter to convert a digital counter value to the coarse ramp.

5. The method of claim 1, further comprising:
generating the fine ramp using a digital-to-analog converter to convert a digital counter value to the fine ramp.

6. The method of claim 1,
wherein the coarse ramp is used to determine most-significant-bits of a digital value for the analog signal; and
wherein the fine ramp is used to determine least-significant-bits of the digital value for the analog signal.

7. The method of claim 1, said applying the analog signal and the coarse ramp to the same input of the comparator, comprising:
applying the analog signal and the coarse ramp to the same input of the comparator through one or more circuit elements such that a signal at the input of the comparator is based on the analog signal and the coarse ramp.

8. The method of claim 1, said applying the analog signal and the coarse ramp to the same input of the comparator, comprising:
providing the coarse ramp to a first terminal of a first capacitor; and
providing the analog signal to a second terminal of the first capacitor;
wherein the second terminal of the first capacitor is connected to a first terminal of a second capacitor, and a second terminal of the second capacitor is connected to the input of the comparator.

9. A dual ramp analog-to-digital converter for performing analog-to-digital conversion of an analog signal, comprising:
at least one circuit element to which the analog signal and a coarse ramp are applied; and
a comparator comprising an input connected to the at least one circuit element, and another input connected to receive a fine ramp.

10. The dual ramp analog-to-digital converter of claim 9,
said at least one circuit element including a storage element, the storage element having a first terminal connected to receive the coarse ramp and a second terminal connected to receive the analog signal.

11. The dual ramp analog-to-digital converter of claim 10, said storage element comprising a capacitor.

12. The dual ramp analog-to-digital converter of claim 10, wherein the second terminal of the storage element is connected to the input of the comparator.

13. The dual ramp analog-to-digital converter of claim 12, wherein the second terminal of the storage element is connected to the input of the comparator through one or more circuit elements.

14. A method for performing analog-to-digital conversion of an analog signal, comprising:
applying the analog signal to an input of a comparator;
applying a coarse ramp to the same input of the comparator to which the analog signal is applied; and
applying a fine ramp to the same input of the comparator to which the analog signal is applied.

15. The method of claim 14,
wherein the analog signal is an output signal of a pixel or an output signal of an amplifier that amplifies a difference between a pixel image signal and a pixel reset signal.

16. A dual ramp analog-to-digital converter for performing analog-to-digital conversion of an analog signal, comprising:
a comparator; and
one or more circuit elements through which the analog signal, a coarse ramp, and a fine ramp are applied to a same input of the comparator.

17. A method for performing analog-to-digital conversion of an analog signal, comprising:
applying the analog signal to an input of a first comparator;
applying a coarse ramp to the input of the first comparator through a coarse ramp switch;
applying the analog signal to an input of a second comparator; and
applying a fine ramp to another input of the second comparator.

18. The method of claim 17, further comprising:
compensating by the second comparator for switch feedthrough from the coarse ramp switch.

19. A dual ramp analog-to-digital converter for performing analog-to-digital conversion of an analog signal, comprising:
a first comparator comprising an input to which the analog signal is applied;
a coarse ramp switch that is controllable to selectively apply a coarse ramp to the same input of the first comparator to which the analog signal is applied; and
a second comparator for compensating for switch feedthrough from the coarse ramp switch, said second comparator comprising an input to which a fine ramp is applied.

20. The dual ramp analog-to-digital converter of claim 19, said coarse ramp switch connected to be controlled by an output of the first comparator.

* * * * *